(12) United States Patent
Kunimasa

(10) Patent No.: US 7,528,415 B2
(45) Date of Patent: May 5, 2009

(54) SEMICONDUCTOR LASER

(75) Inventor: Fumie Kunimasa, Hiroshima-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 419 days.

(21) Appl. No.: 11/407,149

(22) Filed: Apr. 20, 2006

(65) Prior Publication Data

US 2006/0239318 A1   Oct. 26, 2006

(30) Foreign Application Priority Data

Apr. 22, 2005   (JP) ............... 2005-124992

(51) Int. Cl.
*H01L 23/28*   (2006.01)
(52) U.S. Cl. ............... 257/80; 257/787; 257/433; 257/788; 257/796; 257/E21.499
(58) Field of Classification Search .......... 257/80, 257/787, 433, 788, 796, 797, E21.499
See application file for complete search history.

(56) References Cited

U.S. PATENT DOCUMENTS 6,677,173 B2 * 1/2004 Ota ................. 438/22

6,888,866 B2 * 5/2005 Kuniyasu et al. ........ 372/46.01

FOREIGN PATENT DOCUMENTS

| JP | 5-114763 | 5/1993 |
|---|---|---|
| JP | 5-136526 | 6/1993 |
| JP | 2003-31901 | 1/2003 |
| JP | 2004-214441 | 7/2004 |
| JP | 2005-217255 | 8/2005 |

* cited by examiner

*Primary Examiner*—Ngan Ngo
*Assistant Examiner*—Benjamin Tzu-Hung Liu
(74) *Attorney, Agent, or Firm*—Morrison & Foerster LLP

(57) ABSTRACT

A semiconductor laser improved in heat sinkability of portions in the vicinity of a light-emitting end face of a main body in order to prevent occurrence of COD is provided. A main body 150 having a light-emitting end face 150a for emitting laser light is formed on a semiconductor substrate, n-type GaAs substrate. Thickness of a front end portion 112a in the vicinity of the light-emitting end face 150a of a plated metal layer 112 formed on the main body 150 is larger than thickness of a central portion 112b of the plated metal layer 112 in a direction along a cavity.

9 Claims, 6 Drawing Sheets

SEMICONDUCTOR LASER

This nonprovisional application claims priority under 35 U.S.C. §119(a) on Patent Application No. 2005-124992 filed in Japan on Apr. 22, 2005, the entire contents of which are hereby incorporated by reference.

BACKGROUND OF THE INVENTION

The present invention relates to a semiconductor laser.

In semiconductor lasers, conventionally, it is known that increases in optical outputs can cause deterioration of cavity end faces, i.e., COD (Catastrophic Optical Damage). The COD is due to increases in temperature of the cavity end faces involved in high-power operations of semiconductor laser devices. In particular, a high-power semiconductor laser having a reduced reflectivity of a light-emitting end face, which is one of cavity end faces, the temperature increase of the light-emitting end face would be large, causing COD to occur at the light-emitting end face. Thus, it is necessary to improve heat radiation in vicinities of the light-emitting end face.

FIG. 5 shows a schematic perspective view of main part of a conventional semiconductor laser described in JP 2003-31901 A. In FIG. 5, part of the conventional semiconductor laser is removed so that the multilayered structure of the conventional semiconductor laser becomes easier to understand.

The semiconductor laser, as shown in FIG. 5, has an n-type GaAs substrate 512, a main body 550 formed on the n-type GaAs substrate 512, and a p-side plated electrode 530 formed as a so-called overcoat electrode to the main body 550.

The main body 550 includes an n-type buffer layer 514, an n-type AlGaInP clad layer 516, a multiquantum well active layer 518, a p-type AlGaInP clad layer 520, a p-type GaAs contact layer 522 and a $SiO_2$ film 528, as these are formed on the n-type GaAs substrate 512.

In the p-type AlGaInP clad layer 520, a ridge stripe portion 540 extending along a longitudinal direction of the cavity is formed. The upper surface of the ridge stripe portion 540 is covered with the p-type GaAs contact layer 522, and both side faces of the ridge stripe portion 540 are covered with the $SiO_2$ film 528.

Also, a portion in the vicinity of a light-emitting end face 550a of the main body 550 is a window region 532 formed by introduction of zinc. On the window region 532, the p-side plated electrode 530 is not formed. That is, the p-side plated electrode 530 is formed except for portions in the vicinity of the light-emitting end face 550a of the main body 550.

It is noted that reference numeral 534 in FIG. 5 denotes an n-side electrode.

A method for mounting the above-described conventional semiconductor laser onto a stem is described in JP 2004-214441 A.

According to this mounting method, the main body 550, as shown in FIG. 6, is joined by a low-melting-point solder material 602 to a submount 601 that functions as a heat sink. The submount 601 is joined to a high-thermal conductivity stem 603 by bonding resin 604. Such a state is called "junction down" since a pn junction is positioned on the heat sink side, i.e., on the submount 601 side.

Also, the junction between the main body 550 and the submount 601 is done in such a manner that the light-emitting end face 550a of the main body 550 projects from the end face of the submount 601. By doing so, laser light emitted from the light-emitting end face 550a can be prevented from being interrupted by the submount 601, and moreover the laser light can be prevented from being interrupted by sticking of the low-melting-point solder material 602 to the light-emitting end face 550a.

However, since the junction of the main body 550 to the submount 601 causes the light-emitting end face 550a to project from the end face of the submount 601, heat generated in vicinities of the light-emitting end face 550a of the main body 550 cannot efficiently be transferred to the submount 601. This poses a problem of poor heat sinkability at portions in vicinities of the light-emitting end face 550a of the main body 550.

SUMMARY OF THE INVENTION

Accordingly, an object of the present invention is to provide a semiconductor laser which is improved in the heat sinkability at portions in the vicinity of the light-emitting end face of the main body to prevent occurrence of COD.

In order to achieve the above object, there is provided a semiconductor laser comprising:

a semiconductor substrate;

a main body which is formed on the semiconductor substrate and which has a light-emitting end face for emitting laser light; and a plated metal layer formed on the main body, wherein
thickness of a front end portion of the plated metal layer in the vicinity of the light-emitting end face is larger than thickness of a central portion of the plated metal layer in a direction along a cavity.

Herein, the term, main body, refers to a body having a structure for emitting laser light, exemplified by those having a double heterostructure or a single heterostructure.

In this semiconductor laser, for example, in a case where the main body is joined to a heat sink with the plated metal layer facing the heat sink, since the plated metal layer is thicker in its front end portion than in its central portion, heat at portions in the vicinity of the light-emitting end face of the main body can be transferred efficiently to the heat sink via the front end portion of the plated metal layer even with the light-emitting end face of the main body projected from the heat sink. Therefore, heat sinkability of the portions in the vicinity of the light-emitting end face of the main body is improved, so that occurrence of COD at the light-emitting end face can be prevented.

In one embodiment, the main body includes:

a ridge stripe which functions as a current path;

a flat portion formed beside the ridge stripe; and a current blocking layer which is formed so as to cover the side faces of the ridge stripe and the flat portion and which is formed of a dielectric film.

In one embodiment, the main body includes a terrace portion which is formed beside the ridge stripe via the flat portion and which is generally equal in height to the ridge stripe.

In this embodiment, since the terrace portion generally equal in height to the ridge stripe is formed beside the ridge stripe, the ridge stripe is protected from mechanical shocks by the terrace portion. Therefore, any damage of the ridge stripe can be prevented.

In one embodiment, thickness of a rear end portion of the plated metal layer is larger than thickness of the central portion.

In this embodiment, for example, in the case where the main body is joined to the heat sink with the plated metal layer facing the heat sink, since the plated metal layer is thicker in the rear end portion than in the central portion, heat at the end face of the main body on one side opposite to the light-emitting end face side can be transferred efficiently to the heat sink via the rear end portion of the plated metal layer even if the opposite-side end face of the main body opposite to the light-emitting end face side is projected from the heat sink. Therefore, heat sinkability of the portions in the vicinity of the opposite-side end face of the main body opposite to the light-emitting end face side is improved, so that occurrence of COD at the opposite-side end face of the main body opposite to the light-emitting end face side can be prevented.

Further, in the case where laser light is emitted also from the opposite-side end face of the main body opposite to the light-emitting end face side, by the arrangement that the opposite-side end face of the main body opposite to the light-emitting end face side is projected from the heat sink, laser light emitted from the opposite-side end face of the main body opposite to the light-emitting end face side can be prevented from being interrupted by the heat sink. Therefore, APC (Auto Power Control) drive for the semiconductor laser based on the laser light can be implemented with accuracy.

In one embodiment, a step gap surface is formed at a boundary portion between the front end portion and the central portion.

In this embodiment, for example, in a case where the main body is joined to the heat sink with the plated metal layer facing the heat sink, since the plated metal layer has a step gap surface at the boundary portion between the front end portion and the central portion, the step gap surface can be put into thermal contact with one surface of the heat sink generally vertical to the other surface of the heat sink while the central portion of the plated metal layer is held in thermal contact with the other surface of the heat sink. Therefore, the area at which the plated metal layer makes thermal contact with the heat sink can be increased, and the efficiency at which heat of the plated metal layer is transferred to the heat sink can be improved.

In one embodiment, a step gap surface is formed at a boundary portion between the rear end portion and the central portion.

In this embodiment, for example, in a case where the main body is joined to the heat sink with the plated metal layer facing the heat sink, since the plated metal layer has a step gap surface at the boundary portion between the rear end portion and the central portion, the step gap surface can be put into thermal contact with one surface of the heat sink generally vertical to the other surface of the heat sink while the central portion of the plated metal layer is held in thermal contact with the other surface of the heat sink. Therefore, the area at which the plated metal layer makes thermal contact with the heat sink can be increased, and the efficiency at which heat of the plated metal layer is transferred to the heat sink can be improved.

An embodiment comprises a heat sink which is joined to the main body so as to face the plated metal layer, wherein the step gap surface is overlapped with an end face of the heat sink on one side on which the light-emitting end face is placed.

In this embodiment, since the step gap surface located at the boundary portion between the front end portion and the central portion is overlapped with an end face of the heat sink on one side on which the light-emitting end face is placed, heat at the light-emitting end face of the main body can be transferred to the end face of the heat sink to the light-emitting end face side with high efficiency.

An embodiment comprises a heat sink which is joined to the main body so as to face the plated metal layer, wherein the step gap surface is overlapped with an opposite-side end face of the heat sink opposite to its end face placed on the light-emitting end face side.

In this embodiment, since the step gap surface located at the boundary portion between the rear end portion and the central portion is overlapped with an opposite-side end face of the heat sink opposite to its end face placed on the light-emitting end face side, heat at an opposite-side end face of the main body opposite to the light-emitting end face side can be transferred to the opposite-side end face of the heat sink opposite to its end face on the light-emitting end face side with high efficiency.

In one embodiment the plated metal layer is formed except for portions in the vicinity of both side faces of the main body.

In this embodiment, for example, in a case where the main body is joined to the heat sink by means of solder with the plated metal layer facing the heat sink, since the plated metal layer is formed except for portions in the vicinity of both side faces of the main body, short-circuits of currents due to creep-up of the solder to the side faces of the main body can be prevented.

In this semiconductor laser, for example, in a case where the main body is joined to the heat sink with the plated metal layer facing the heat sink, since the plated metal layer is thicker in its front end portion than in its central portion, heat at portions in the vicinity of the light-emitting end face of the main body can be transferred efficiently to the heat sink via the front end portion of the plated metal layer even with the light-emitting end face of the main body projected from the heat sink. Therefore, heat sinkability of the portions in the vicinity of the light-emitting end face of the main body is improved, so that occurrence of COD at the light-emitting end face can be prevented.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Hereinbelow, the semiconductor laser of the present invention will be described in detail by embodiments thereof illustrated in the accompanying drawings.

First Embodiment

Figure 1:
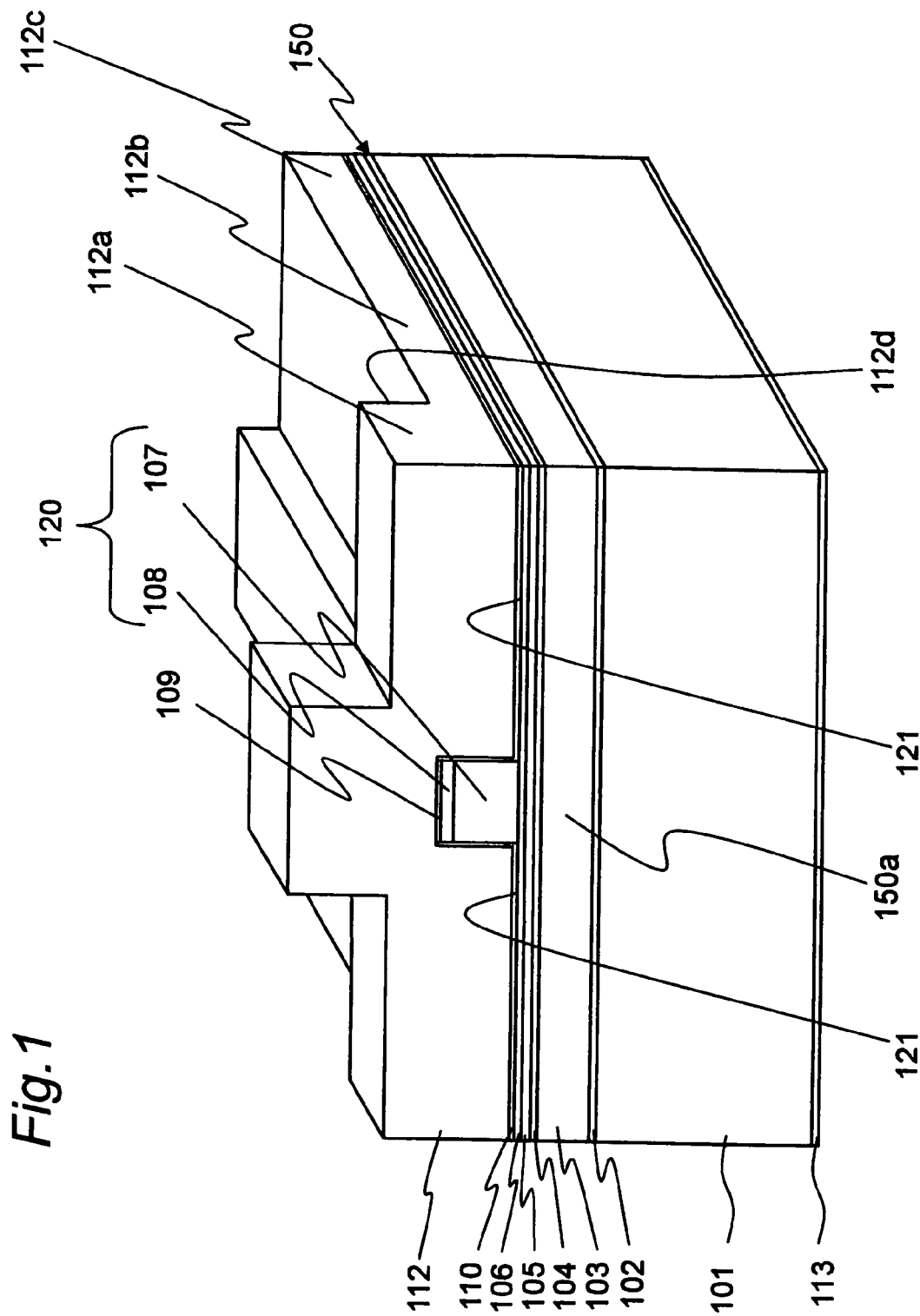
FIG. 1 is a schematic perspective view of main part of a semiconductor laser according to a first embodiment of the present invention.

FIG. 1 shows a schematic perspective view of main part of a semiconductor laser according to a first embodiment of the invention.

The semiconductor laser has an n-type GaAs substrate 101 as an example of the semiconductor substrate, a main body 150 formed on the n-type GaAs substrate 101 and having a light-emitting end face 150a that emits laser light, and a plated metal layer 112 formed on the main body 150.

The main body 150 includes an n-type GaInP buffer layer 102, an n-type AlGaInP clad layer 103, a quantum well active layer 104, a p-type AlGaInP first clad layer 105 and an etching stop layer 106, as these are sequentially stacked on the n-type GaAs substrate 101.

The main body 150 also includes a ridge stripe 120 formed on the etching stop layer 106, a p-side contact electrode 109 formed on the ridge stripe 120, and a dielectric film 110 which is formed so as to cover a side face of the ridge stripe 120 and which is composed of, for example, $SiO_2$. The dielectric film 110 is an example of a current blocking layer.

The ridge stripe 120 is composed of a p-type AlGaInP second clad layer 107 and a p-type GaAs contact layer 108.

The p-side contact electrode 109 has a width (left-and-right crosswise length in FIG. 1) generally equal to that of the ridge stripe 120.

The dielectric film 110 also covers ridge-stripe side flat portions 121 which are present on both sides of the ridge stripe 120. The ridge-stripe side flat portions 121 are formed of portions having no ridge stripe 120 out of the upper surface (ridge stripe 120 side surface) of the etching stop layer 106.

The plated metal layer 112 is composed of, for example, Au. Then, the thickness of a front end portion 112a of the plated metal layer 112 on the light-emitting end face 150a side is larger than the thickness of a central portion 112b of the plated metal layer 112 in a direction along the cavity. At a boundary portion between the front end portion 112a and the central portion 112b, the layer thickness of the plated metal layer 112 abruptly changes, by which a step gap surface 112d is formed. The step gap surface 112d extends generally vertical to the n-type GaAs substrate 101. That is, the step gap surface 112d is generally parallel to the direction of layer stacking.

Further, the thickness of a rear end portion 112c of the plated metal layer 112 on its one side opposite to the light-emitting end face 150a side is generally equal to the thickness of the central portion 112b of the plated metal layer 112 in the direction along the cavity.

In addition, it is an n-side electrode 113 that is formed under the n-type GaAs substrate 101.

Now manufacturing process for the above-described semiconductor laser is explained below.

First, on the n-type GaAs substrate 101, epitaxial growth is applied to effectuate crystal growth of an n-type GaInP buffer layer 102, an n-type AlGaInP clad layer 103, a quantum well active layer 104, a p-type AlGaInP first clad layer 105, an etching stop layer 106, a p-type AlGaInP second clad layer 107 and a p-type GaAs contact layer 108 in this order.

Next, the p-type AlGaInP second clad layer 107 and the p-type GaAs contact layer 108 are partly removed by wet etching to form a ridge stripe 120, which serves as an optical waveguide and a current path. The ridge stripe 120 may be formed by either dry etching or wet etching. Also, the ridge stripe 120 may be formed by a combination of dry etching and wet etching.

Next, a dielectric film 110 is deposited so as to cover a side face of the ridge stripe 120 and the upper surface of the etching stop layer 106. The dielectric film 110 does not cover the upper surface of the ridge stripe 120. The dielectric film 110 may be formed by using, for example, at least one of $SiO_2$, $SiN_x$ and $Al_2O_3$.

Next, a p-side contact electrode 109 is formed only on the upper surface of the ridge stripe 120.

Next, the material of the plated metal layer 112, Au, is formed all over the wafer. In this case, the Au is formed so as to have a generally identical layer thickness all over. More specifically, in this case, the layer thickness of Au is set within a range of 0.5 μm to 3.0 μm.

Next, Au is additionally formed only at places which are in the vicinity of the light-emitting end face 150a. As a result of this, a plated metal layer 112 having an aimed configuration is obtained. On the upper surface (a surface on one side opposite to the ridge stripe 120 side) of the plated metal layer 112 is formed an abrupt step gap surface 112d. The layer thickness of Au additionally formed as described above is set within a range of 0.5 μm to 5.0 μm. As a result of this, the thickness of the front end portion 112a of the plated metal layer 112 becomes within a range of 1.0 μm to 8.0 μm, and the thickness of the central portion 112b of the plated metal layer 112 becomes within a range of 0.5 μm to 3.0 μm.

Next, the n-type GaAs substrate 101 is polished from its rear face side so as to be thinned, and then an n-side electrode 113 is formed on the rear face of the n-type GaAs substrate 101 and thereafter division into chips is performed. Thus, a plurality of semiconductor laser chips are obtained.

Figure 2:
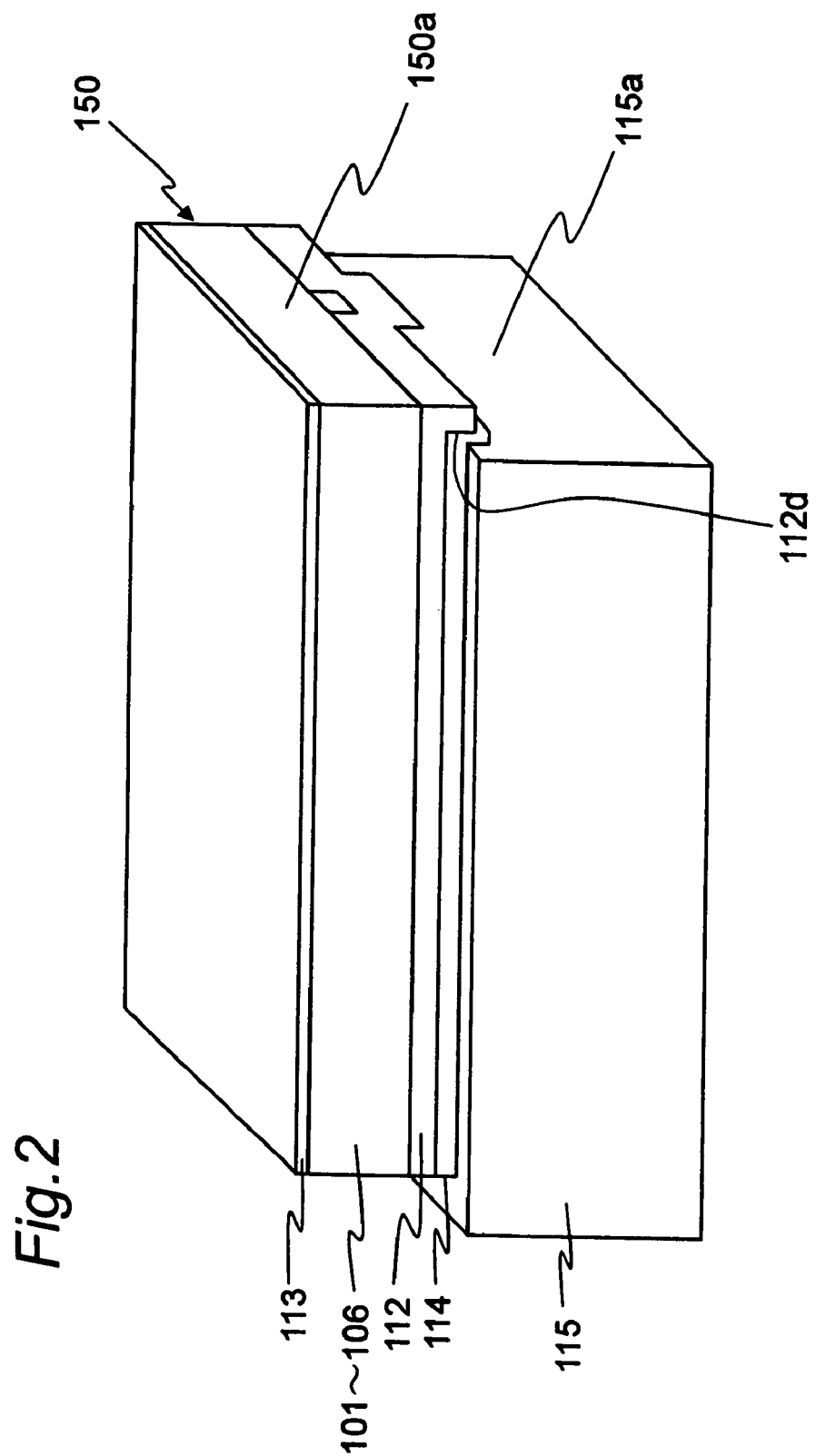
FIG. 2 is a schematic view of a mount state of the main body of the semiconductor laser of the first embodiment.

Subsequently, as shown in FIG. 2, the main body 150 is mounted on a heat sink 115 with the plated metal layer 112 facing the heat sink 115. More specifically, the plated metal layer 112 is joined to the heat sink 115 by means of a solder material 114 made of AuSn, and the step gap surface 112d of the plated metal layer 112 overlaps with a front end face 115a of the heat sink 115 on the light-emitting end face 150a side. As a result of this, the light-emitting end face 150a is projected from the heat sink 115, so that laser light emitted from the light-emitting end face 150a can be prevented from being interrupted by the heat sink 115 and moreover prevented from being interrupted by the solder material 114, because the solder material 114 does not stick to the light-emitting end face 150a.

Also, by the overlapping of the step gap surface 112d of the plated metal layer 112 with the front end face 115a of the heat sink 115, the step gap surface 112d of the plated metal layer 112 thermally makes contact with the front end face 115a of the heat sink 115 via the solder material 114. As a result of this, heat generated at portions in the vicinity of the light-emitting end face 150a of the main body 150 is efficiently transferred to the heat sink 115 via the front end portion 112a of the plated metal layer 112 made of Au, which has a high thermal conductivity. Accordingly, temperature increases in the light-emitting end face 150a are suppressed so that occurrence of COD at the light-emitting end face 150a can be prevented. More specifically, the optical power with occurrence of COD becomes 330 mW in CW (continuous wave) drive, thus high power operation being enabled.

In addition, with a plated metal layer of uniform thickness used instead of the plated metal layer 112, the optical power with occurrence of COD was 300 mW in CW (continuous wave) drive.

Second Embodiment

Figure 3:
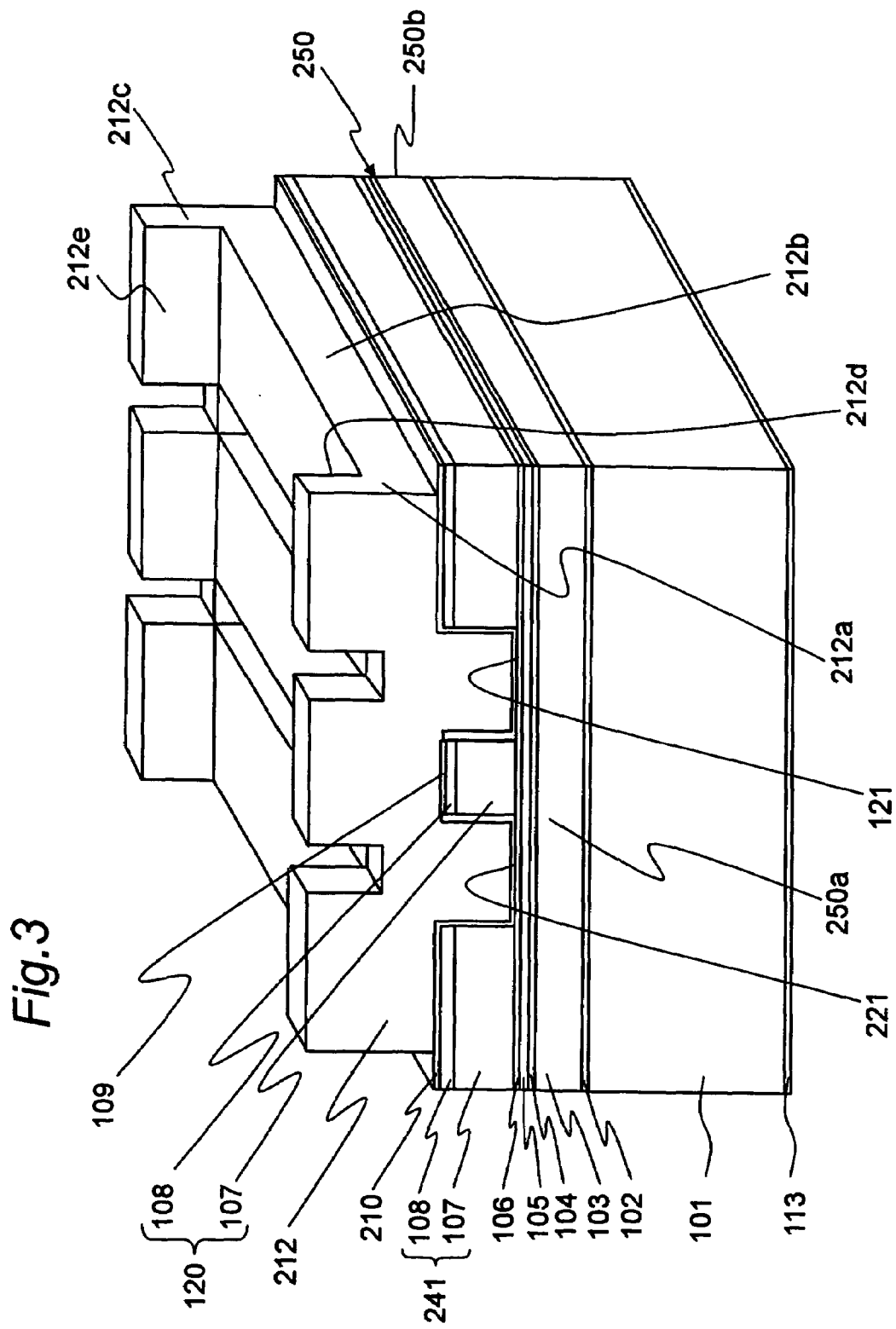
FIG. 3 is a schematic perspective view of main part of a semiconductor laser according to a second embodiment of the present invention

FIG. 3 shows a schematic perspective view of main part of a semiconductor laser according to a second embodiment of the invention. In FIG. 3, the same constituent parts as those shown in FIG. 1 are designated by the same reference numerals as those of the constituent parts in FIG. 1 and their description is omitted.

The semiconductor laser has an n-type GaAs substrate 101, a main body 250 formed on the n-type GaAs substrate 101 and having a light-emitting end face 250a that emits laser light, and a plated metal layer 212 formed on the main body 250.

The main body 250 includes an n-type GaInP buffer layer 102, an n-type AlGaInP clad layer 103, a quantum well active layer 104, a p-type AlGaInP first clad layer 105 and an etching stop layer 106, as these are sequentially stacked on the n-type GaAs substrate 101.

The main body 250 also includes a ridge stripe 120 formed on the etching stop layer 106, a p-side contact electrode 109 formed on the ridge stripe 120, and a dielectric film 210 formed so as to cover side faces of the ridge stripe 120, and terrace portions 241 formed on both sides of the ridge stripe 120. The dielectric film 210 is an example of the current blocking layer.

The terrace portions 241, each of which is composed of a p-type AlGaInP second clad layer 107 and a p-type GaAs contact layer 108, are generally equal in height to the ridge stripe 120. Also, the terrace portions 241 are formed so as to be spaced from the ridge stripe 120 with a spacing of 5 μm to 100 μm. That is, the distance between the terrace portions 241 and the ridge stripe 120 is 5 μm to 100 μm.

The dielectric film 210 covers a side face of each terrace portion 241 on the ridge stripe 120 side, an upper surface of each terrace portion 241, and ridge-stripe side flat portions 221 present on both sides of the ridge stripe 120. These ridge-stripe side flat portions 221 are formed of portions having neither ridge stripe 120 nor terrace portion 241 out of the upper surface (ridge stripe 120 side surface) of the etching stop layer 106.

The plated metal layer 212 is composed of, for example, Au. The plated metal layer 212 is formed except for portions in the vicinity of both side faces of the main body 250. More specifically, the plated metal layer 212 is not formed at portions having a width of 5 μm to 40 μm from the side face of the main body 250 toward the ridge stripe 120.

The thickness of a front end portion 212a of the plated metal layer 212 on the light-emitting end face 250a side is larger than the thickness of a central portion 212b of the plated metal layer 212 in a direction along the cavity. At a boundary portion between the front end portion 212a and the central portion 212b, the layer thickness of the plated metal layer 212 abruptly changes, by which a step gap surface 212d is formed. The step gap surface 212d extends generally vertical to the n-type GaAs substrate 101. That is, the step gap surface 212d is generally parallel to the direction of layer stacking.

Further, the thickness of a rear end portion 212c of the plated metal layer 212 on its one side opposite to the light-emitting end face 250a side is generally equal to the thickness of the front end portion 212a of the plated metal layer 212. That is, the thickness of the rear end portion 212c of the plated metal layer 212 on its one side opposite to the light-emitting end face 250a side is larger than the thickness of the central portion 212b of the plated metal layer 212. At a boundary portion between the rear end portion 212c and the central portion 212b, the layer thickness of the plated metal layer 212 abruptly changes, by which a step gap surface 212e is formed. The step gap surface 212e extends generally vertical to the n-type GaAs substrate 101. That is, the step gap surface 212e is generally parallel to the direction of layer stacking.

The above-described plated metal layer 212 is formed as follows.

First, the material of the plated metal layer 212, Au, is deposited except for places which are in the vicinity of both side faces of the main body 250. More specifically, Au is stacked by selective plating except for places having a width of 5 μm to 40 μm from the side face of the main body 250 toward the ridge stripe 120. In this case, the Au is stacked so as to be generally uniform in thickness. More specifically, in this case, the layer thickness of Au is set within a range of 0.5 μm to 3.0 μm.

Next, Au is additionally stacked only at places which are in the vicinity of the light-emitting end face 250a and in the vicinity of a rear end face 250b on one side of the main body 250 opposite to the light-emitting end face 250a side. As a result of this, a plated metal layer 212 having an aimed configuration is obtained. On the upper surface of the plated metal layer 212 are formed abrupt step gap surfaces 212d, 212e. The layer thickness of Au additionally stacked as described above is set within a range of 0.5 μm to 5.0 μm. As a result of this, the thicknesses of the front end portion 212a and the rear end portion 212c of the plated metal layer 212 become within a range of 1.0 μm to 8.0 μm, and the thickness of the central portion 212b of the plated metal layer 212 become within a range of 0.5 μm to 3.0 μm.

Figure 4:
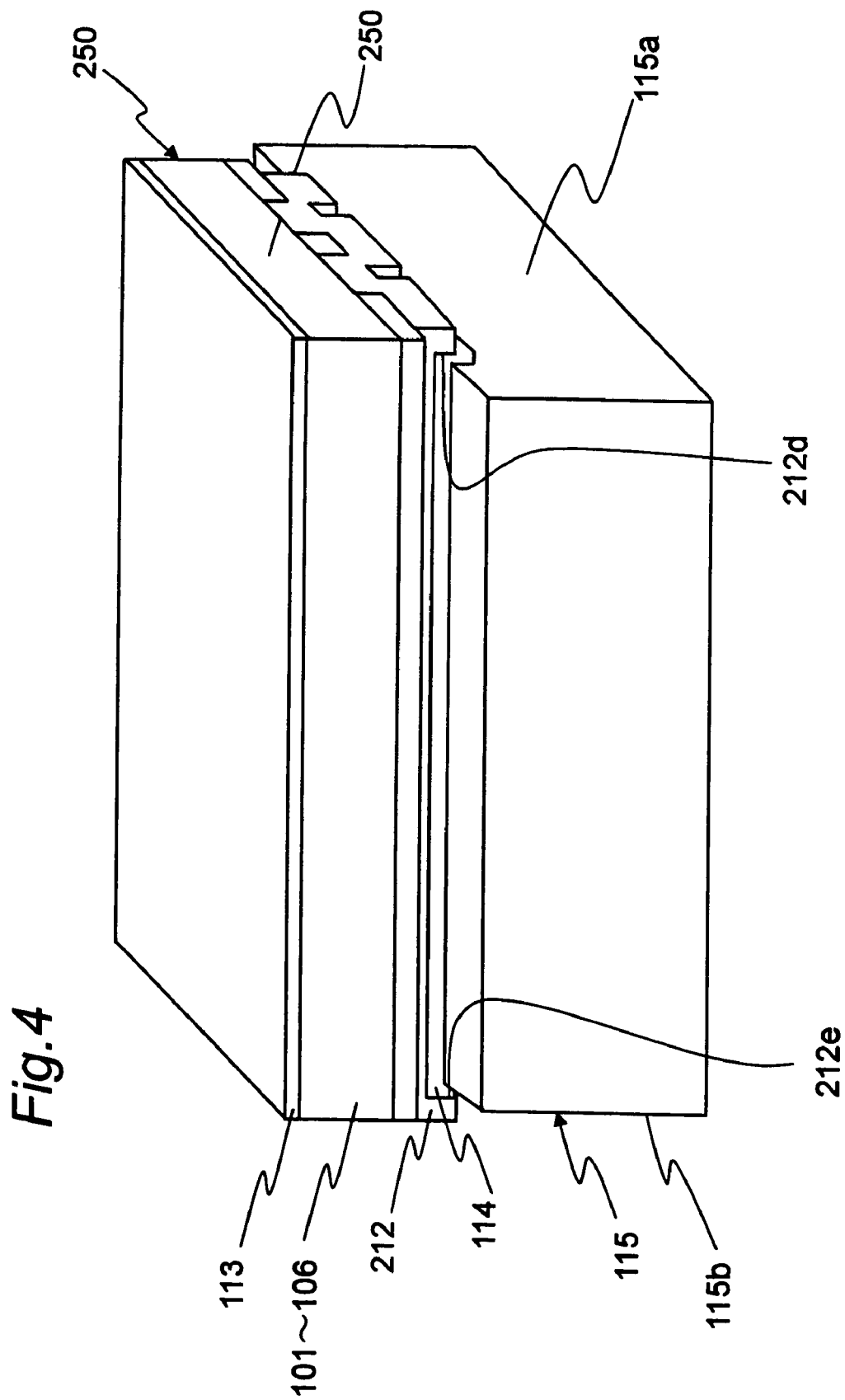
FIG. 4 is a schematic view of a mount state of the main body of the semiconductor laser of the second embodiment.
Figure 5:
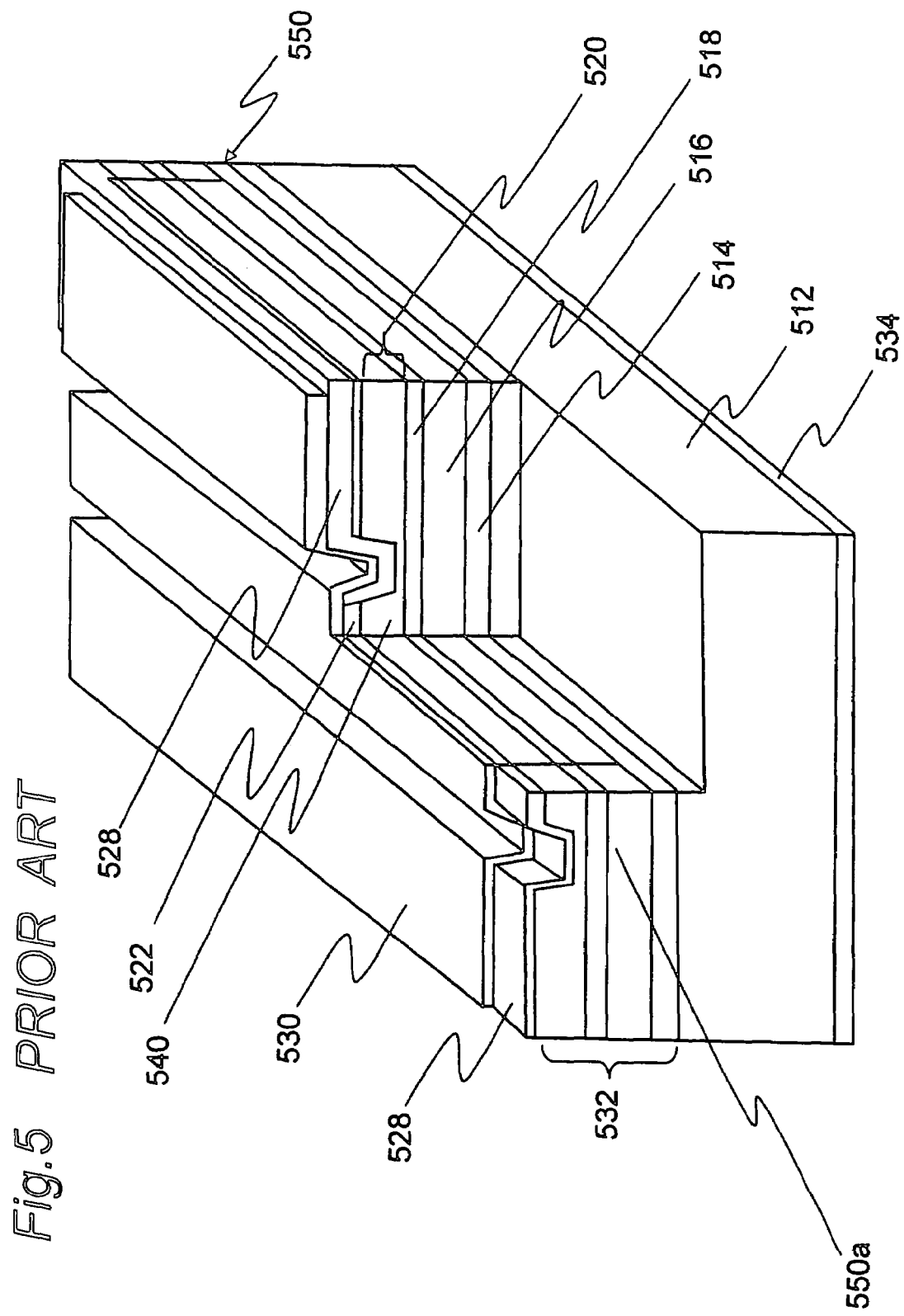
FIG. 5 is a schematic perspective view of the main body of a semiconductor laser according to a prior art.
Figure 6:
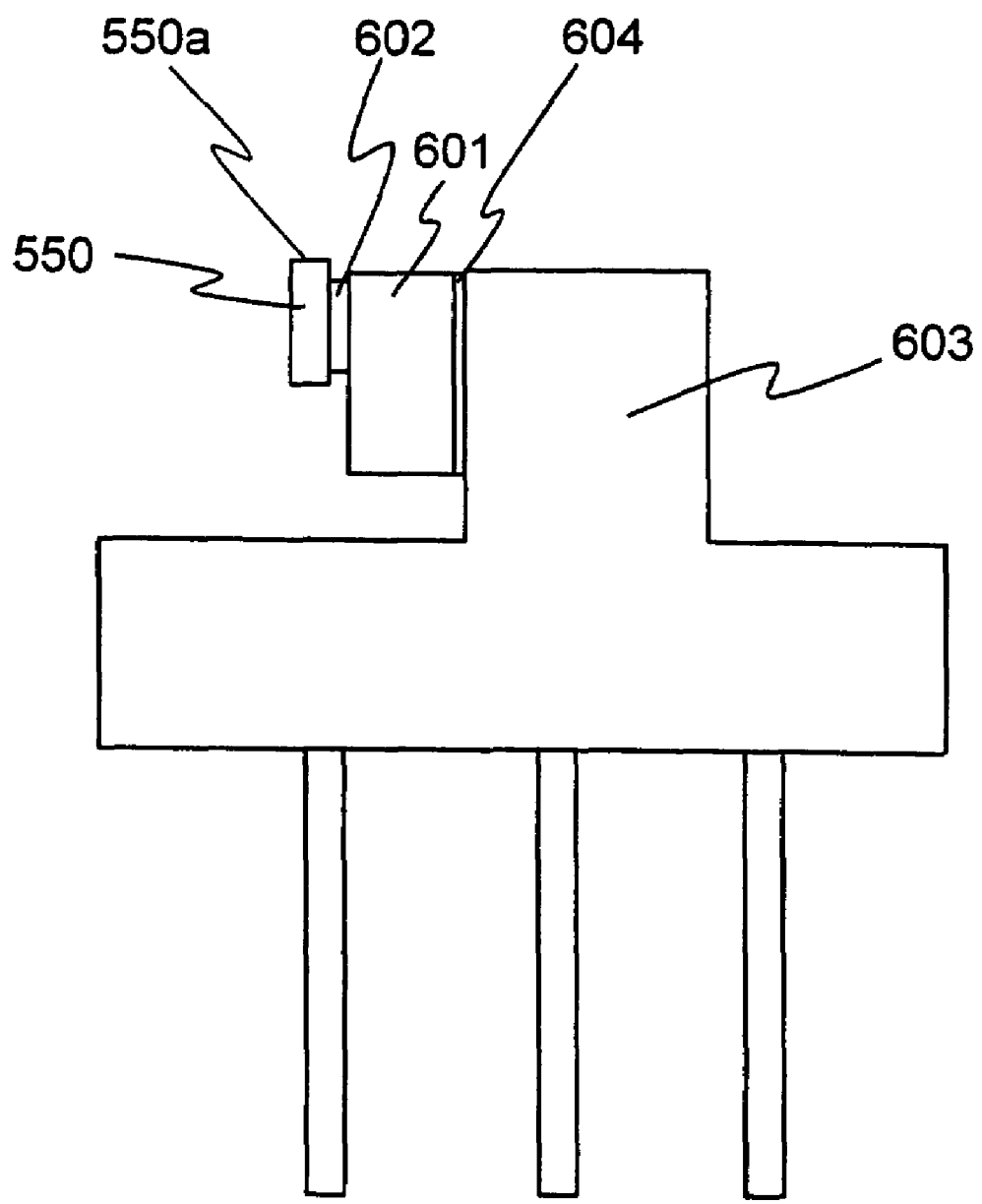
FIG. 6 is a schematic view of a mount state of the main body of a conventional semiconductor laser.

While the plated metal layer 212 formed as shown above is held facing a heat sink 115 as shown in FIG. 4, the main body 250 is mounted on the heat sink 115. More specifically, the plated metal layer 212 is joined to the heat sink 115 by means of a solder material 114 made of AuSn, the step gap surface 212d of the plated metal layer 212 overlaps with the front end face 115a of the heat sink 115, and the step gap surface 212e of the plated metal layer 212 overlaps with a rear end face 115b of the heat sink 115 on one side opposite to the light-emitting end face 250a side. As a result of this, the light-emitting end face 250a is projected from the heat sink 115, so that laser light emitted from the light-emitting end face 250a can be prevented from being interrupted by the heat sink 115 and moreover prevented from being interrupted by the solder material 114, because the solder material 114 does not stick to the light-emitting end face 250a.

Also, by the overlapping of the step gap surface 212d of the plated metal layer 212 with the front end face 115a of the heat sink 115, the step gap surface 212d of the plated metal layer 212 thermally makes contact with the front end face 115a of the heat sink 115 via the solder material 114. As a result of this, heat generated at the portions in the vicinity of the light-emitting end face 250a of the main body 250 is efficiently transferred to the heat sink 115 via the front end portion 212a of the plated metal layer 212 made of Au, which has a high thermal conductivity. Accordingly, temperature increases in the light-emitting end face 250a are suppressed so that occurrence of COD at the light-emitting end face 250a can be prevented.

Besides, by the overlapping of the step gap surface 212e of the plated metal layer 212 with the rear end face 115b of the heat sink 115, the step gap surface 212e of the plated metal layer 212 thermally makes contact with the rear end face 115b of the heat sink 115 via the solder material 114. As a result of this, heat generated in the vicinity of the rear end face 250b of the main body 250 is efficiently transferred to the heat sink 115 via the rear end portion 212c of the plated metal layer 212 made of Au, which has a high thermal conductivity. Accordingly, temperature increases in the rear end face 250b of the main body 250 are suppressed so that occurrence of COD at the rear end face 250b can be prevented.

Further, since the end face 250b is projected from the heat sink 115 as a result of the junction between the main body 250 and the heat sink 115, short-circuits of currents due to sticking of the solder material 114 to the rear end face 250b can be prevented.

Further, since the plated metal layer 212 is formed except for portions in the vicinity of both side faces of the main body 250, electrode short-circuits due to creep-up of the solder material 114 to the side faces of the main body 250 can be prevented. Thus, characteristic failures due to the electrode short-circuits can be prevented.

Further, since the terrace portions 241 are formed on both sides of the ridge stripe 120, it can be avoided that only the ridge stripe 120 makes a protruding portion during semiconductor laser fabrication process, so that the ridge stripe 120 can be prevented from damage during the fabrication process. Thus, the semiconductor laser yield is improved.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor laser comprising:
a semiconductor substrate;
a main body which is formed on the semiconductor substrate and which has a light-emitting end face for emitting laser light; and
a plated metal layer formed on the main body, wherein
a thickness of a front end portion of the plated metal layer in the vicinity of the light-emitting end face is larger than a thickness of a central portion of the plated metal layer in a direction along a cavity.

2. The semiconductor laser as claimed in claim 1, wherein the main body includes:
a ridge stripe which functions as a current path;
a flat portion formed beside the ridge stripe; and
a current blocking layer which is formed so as to cover the side faces of the ridge stripe and the flat portion and which is formed of a dielectric film.

3. The semiconductor laser as claimed in claim 1, wherein the main body includes a terrace portion which is formed beside the ridge stripe via the flat portion and which is generally equal in height to the ridge stripe.

4. The semiconductor laser as claimed in claim 1, wherein a thickness of a rear end portion of the plated metal layer is larger than the thickness of the central portion.

5. The semiconductor laser as claimed in claim 4, wherein a step gap surface is formed at a boundary portion between the rear end portion and the central portion.

6. The semiconductor laser as claimed in claim 5, further comprising
a heat sink which is joined to the main body so as to face the plated metal layer, wherein
the step gap surface is overlapped with an opposite-side end face of the heat sink opposite to its end face placed on the light-emitting end face side.

7. The semiconductor laser as claimed in claim 1, wherein a step gap surface is formed at a boundary portion between the front end portion and the central portion.

8. The semiconductor laser as claimed in claim 7, further comprising
a heat sink which is joined to the main body so as to face the plated metal layer, wherein
the step gap surface is overlapped with an end face of the heat sink on one side on which the light-emitting end face is placed.

9. The semiconductor laser as claimed in claim 1, wherein the plated metal layer is formed over the main body except for portions in the vicinity of both side faces of the main body.

* * * * *